(12) United States Patent
Bar et al.

(10) Patent No.: US 12,527,098 B2
(45) Date of Patent: Jan. 13, 2026

(54) IMAGE SENSOR MANUFACTURING METHOD

(71) Applicant: STMicroelectronics (Crolles 2) SAS, Crolles (FR)

(72) Inventors: Pierre Bar, Grenoble (FR); Jean Luc Huguenin, Rives (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 547 days.

(21) Appl. No.: 17/815,522

(22) Filed: Jul. 27, 2022

(65) Prior Publication Data

US 2023/0050334 A1 Feb. 16, 2023

(30) Foreign Application Priority Data

Aug. 10, 2021 (FR) ........................... 2108614

(51) Int. Cl.
*H10F 39/00* (2025.01)

(52) U.S. Cl.
CPC ....... *H10F 39/024* (2025.01); *H10F 39/8063* (2025.01)

(58) Field of Classification Search
CPC .... H10F 39/024; H10F 39/8063; H10F 19/75; H10F 39/8033; H10F 39/026; H02K 15/0433
See application file for complete search history.

(56) References Cited

U.S. PATENT DOCUMENTS

| | | | | |
|---|---|---|---|---|
| 5,266,501 | A * | 11/1993 | Imai | H10F 77/413 438/69 |
| 7,348,202 | B2 * | 3/2008 | Lee | H01L 27/14627 438/57 |
| 8,063,257 | B2 * | 11/2011 | Ma | C07C 17/04 570/136 |
| 2005/0201714 | A1* | 9/2005 | Mune | G02B 1/045 385/129 |
| 2007/0082423 | A1* | 4/2007 | Lee | H10F 39/024 438/60 |
| 2008/0153194 | A1* | 6/2008 | Jeong | H10F 39/024 257/E31.127 |
| 2008/0156970 | A1* | 7/2008 | Han | H10F 39/8063 438/70 |
| 2009/0032895 | A1* | 2/2009 | Park | H10F 39/8063 438/70 |
| 2009/0061556 | A1* | 3/2009 | Ryu | H10F 39/8063 257/E31.127 |
| 2009/0124037 | A1* | 5/2009 | Yu | H10F 39/024 257/E31.127 |
| 2009/0170233 | A1* | 7/2009 | Yun | H10F 39/026 438/70 |

(Continued)

FOREIGN PATENT DOCUMENTS

KR 1020110075948 A 7/2011

*Primary Examiner* — Chad M Dicke
*Assistant Examiner* — Gary Abel
(74) *Attorney, Agent, or Firm* — Slater Matsil, LLP

(57) ABSTRACT

In an embodiment a method for manufacturing an image sensor includes forming of a plurality of microlenses at a first resin layer, forming a mask on top of and in contact with the first resin layer, the mask comprising a second resin; and chemical plasma etching the first resin layer through the mask.

20 Claims, 5 Drawing Sheets

(56) References Cited

U.S. PATENT DOCUMENTS

| | | | |
|---|---|---|---|
| 2012/0009719 A1* | 1/2012 | Ahn | H10F 39/026 |
| | | | 257/E31.127 |
| 2015/0340578 A1* | 11/2015 | Tamaki | H01L 24/97 |
| | | | 257/99 |
| 2019/0296202 A1* | 9/2019 | Chen | H01L 24/20 |
| 2020/0357955 A1* | 11/2020 | Chuang | H10H 20/8314 |
| 2021/0234077 A1* | 7/2021 | Toyama | H10H 20/853 |
| 2024/0153977 A1* | 5/2024 | Otsuka | H10F 39/8053 |

* cited by examiner

[Fig. 1]
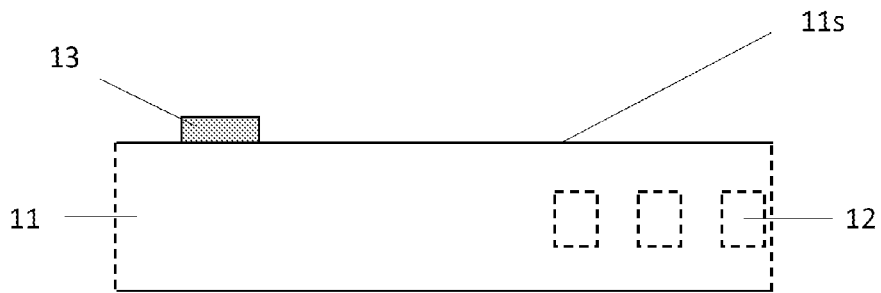
[Fig. 2]
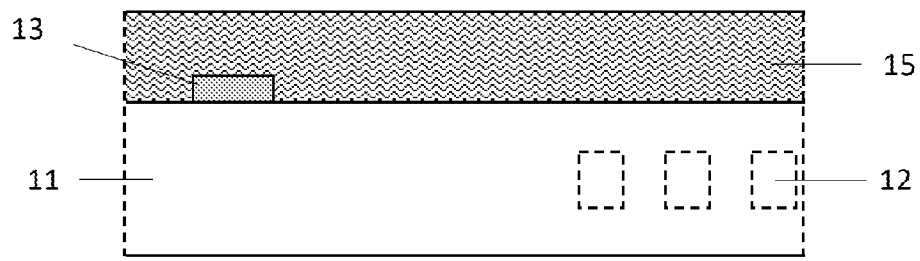
[Fig. 3]
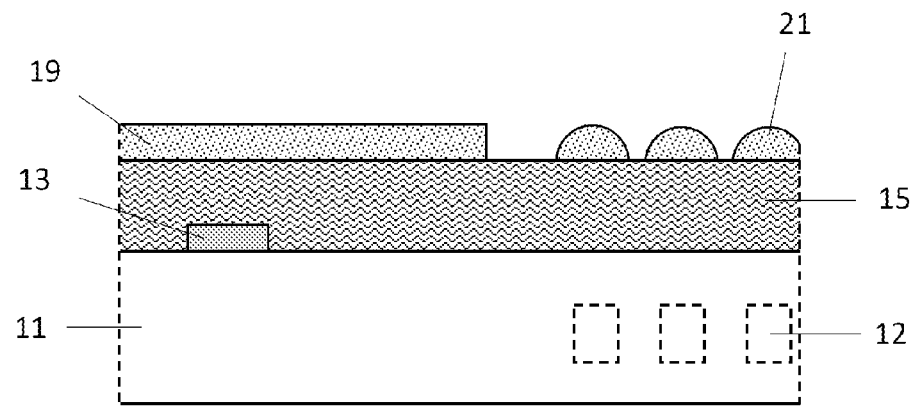

[Fig. 4]
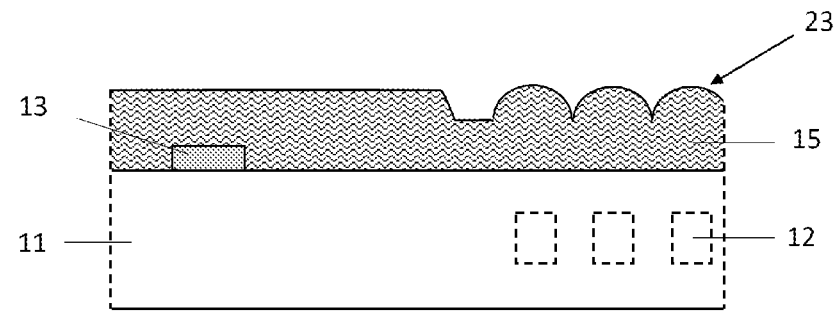
[Fig. 5]
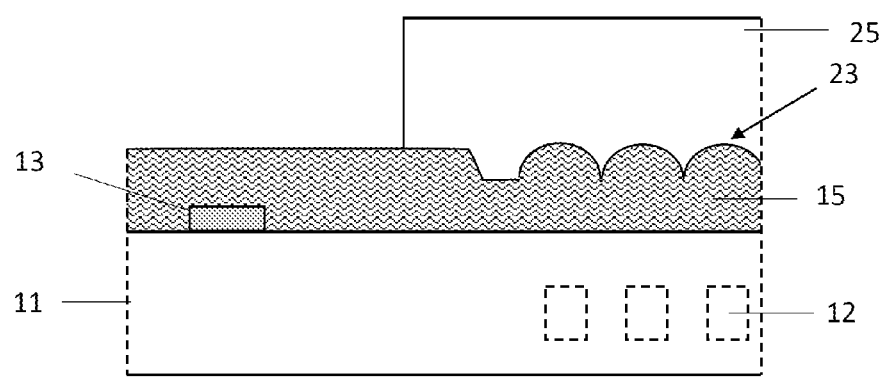
[Fig. 6]
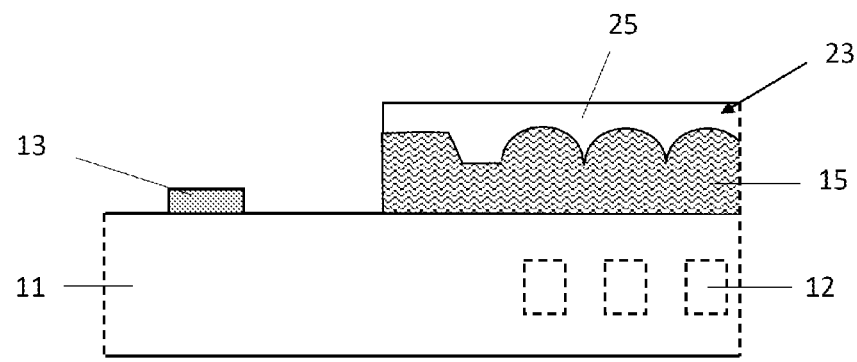

[Fig. 7]
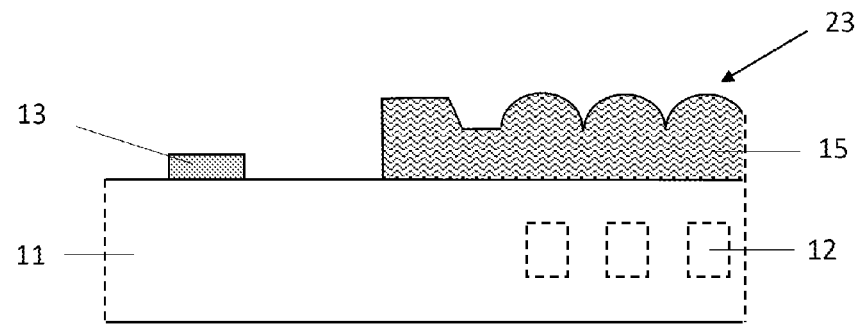
[Fig. 8]
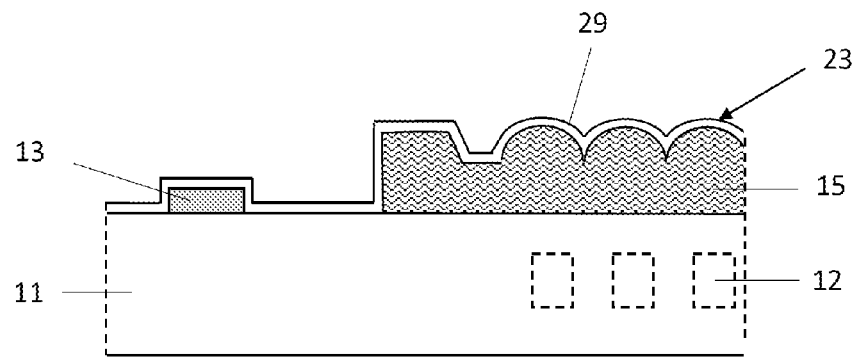
[Fig. 9]
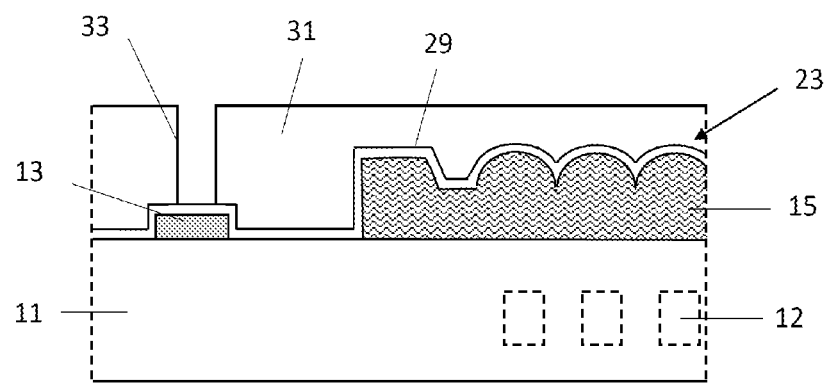

[Fig. 10]
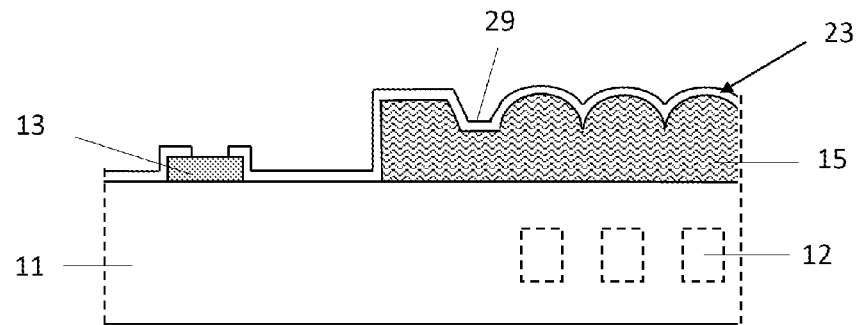
[Fig. 11]
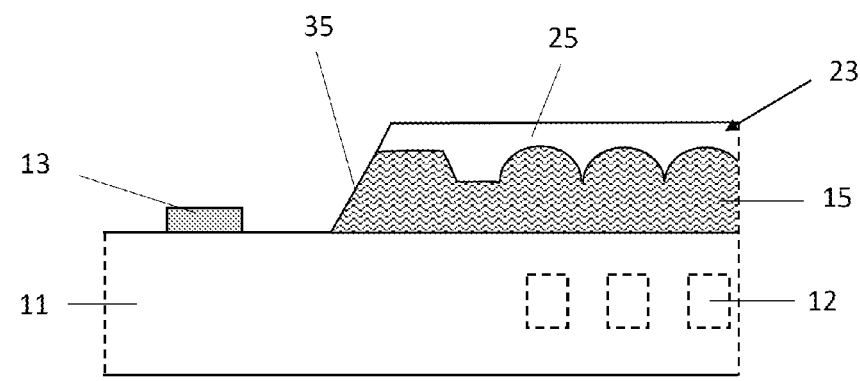
[Fig. 12]
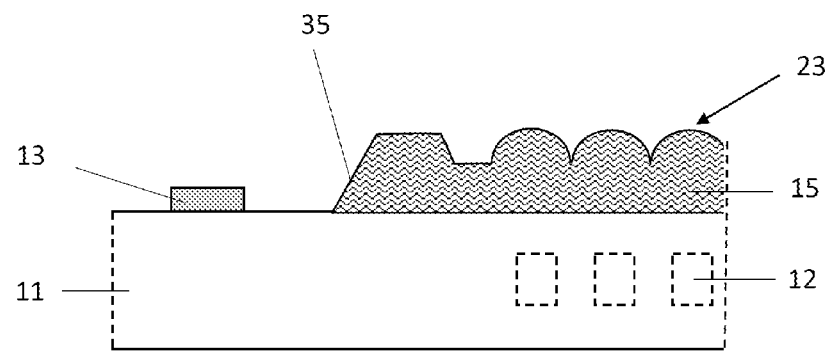

[Fig. 13]
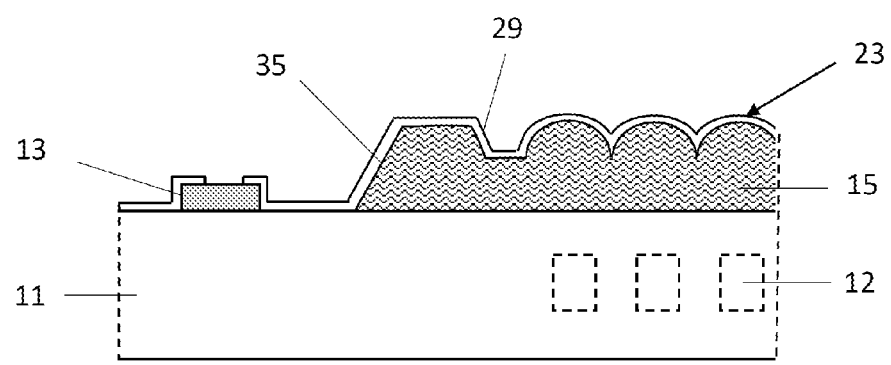

IMAGE SENSOR MANUFACTURING METHOD

CROSS-REFERENCE TO RELATED APPLICATIONS

This application claims the benefit of French Application No. 2108614, filed on Aug. 10, 2021, which application is hereby incorporated herein by reference.

TECHNICAL FIELD

The present disclosure generally concerns the field of image sensors and more particularly aims at an image sensor manufacturing method.

BACKGROUND

An image sensor generally comprises a plurality of photodetectors, for example, photodiodes, integrated inside and on top of a semiconductor substrate.

Image sensors having their photodetectors topped with a layer of microlenses are here more particularly considered. This microlens layer enables to focus incident radiations on the photodetectors.

It would be desirable to at least partly improve certain aspects of known methods of manufacturing an image sensor comprising a layer of microlenses.

SUMMARY

Embodiments provide an image sensor manufacturing process.

An embodiment provides an image sensor manufacturing method comprising:
  a) the forming of a plurality of microlenses in a layer made of a first resin;
  b) after step a), the forming of a mask made of a second resin, on top of and in contact with said layer; and
  c) after step b), the chemical plasma etching of said layer, through the mask.

According to an embodiment, said layer covers a surface of a semiconductor substrate where a plurality of photodetectors has been previously formed.

According to an embodiment, said layer further covers a contacting pad previously formed on the substrate.

According to an embodiment, during step c), the contacting pad is exposed.

According to an embodiment, at step a), the forming of the microlenses comprises a step d) of forming of microlens-shaped structures in a layer made of a third resin, followed by a step e) of transfer of said structures into the layer made of the first resin by physical etching.

According to an embodiment, at step d), the structures are formed by photolithography and flowing.

According to an embodiment, the method comprises, after step c), a step of deposition of a protection and insulation layer at the surface and on the sides of the layer made of the first resin.

According to an embodiment, after step c), the mask is removed by means of a solvent.

According to an embodiment, the layer made of the first resin is crosslinked.

According to an embodiment, the layer of the first resin is non-photosensitive.

According to an embodiment, the plasma comprises oxygen.

An embodiment provides an image sensor comprising a semiconductor substrate having a plurality of photodetectors integrated inside and on top of it, the substrate being coated with a layer made of a first resin having a plurality of microlenses formed therein, said layer comprising an opening opposite a contacting pad arranged on the substrate, said opening having inclined lateral walls.

BRIEF DESCRIPTION OF THE DRAWINGS

The foregoing features and advantages, as well as others, will be described in detail in the following description of specific embodiments given by way of illustration and not limitation with reference to the accompanying drawings, in which:

FIG. 1 is a cross-section view illustrating a device obtained at the end of a step of an example of an image sensor manufacturing method;

FIG. 2 is a cross-section view illustrating a device obtained at the end of another step of an example of an image sensor manufacturing method;

FIG. 3 is a cross-section view illustrating a device obtained at the end of another step of an example of an image sensor manufacturing method;

FIG. 4 is a cross-section view illustrating a device obtained at the end of another step of an example of an image sensor manufacturing method;

FIG. 5 is a cross-section view illustrating a device obtained at the end of another step of an example of an image sensor manufacturing method;

FIG. 6 is a cross-section view illustrating a device obtained at the end of another step of an example of an image sensor manufacturing method;

FIG. 7 is a cross-section view illustrating a device obtained at the end of another step of an example of an image sensor manufacturing method;

FIG. 8 is a cross-section view illustrating a device obtained at the end of another step of an example of an image sensor manufacturing method;

FIG. 9 is a cross-section view illustrating a device obtained at the end of another step of an example of an image sensor manufacturing method;

FIG. 10 is a cross-section view illustrating a device obtained at the end of another step of an example of an image sensor manufacturing method;

FIG. 11 is a cross-section view illustrating a device obtained at the end of a step of an example of an image sensor manufacturing method according to an implementation mode;

FIG. 12 is a cross-section view illustrating a device obtained at the end of another step of an example of an image sensor manufacturing method according to an implementation mode; and FIG. 13 is a cross-section view illustrating a device obtained at the end of another step of an example of an image sensor manufacturing method according to an implementation mode.

DETAILED DESCRIPTION OF ILLUSTRATIVE EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, the forming of the photodetectors of the described image sensors, as well as of their control circuits, has not been detailed, the forming of these elements being within the abilities of those skilled in the art based on the indications of the present description.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

FIGS. 1 to 10 schematically and partially illustrate devices or structures obtained at the end of successive steps of an example of an image sensor manufacturing method.

More particularly, FIG. 1 corresponds to an initial structure comprising a semiconductor substrate 11, for example, a silicon substrate, where photodetectors 12 have been previously formed. As an example, photodetectors 12 are photodiodes, for example, adapted to detecting an infrared, visible, and/or ultraviolet radiation. As an example, photodetectors 12 are photodetectors made in CMOS ("Complementary Metal Oxide Semiconductor") technology.

In this example, substrate 11 is intended to be illuminated from its upper surface 11s. The initial structure illustrated in FIG. 1 further comprises one or a plurality of contacting pads 13 located on the upper surface side of substrate 11. Pads 13 are intended to be connected to an external device, for example, by means of electrically-conductive wires, for example, metal wires. Pads 13 are arranged outside of the locations above photodetectors 12 to avoid masking photodetectors 12. As an example, in top view, photodetectors 12 are located in a central region of substrate 11, and pads 13 are located opposite a peripheral region of substrate 11.

As an example, contacting pads 13 are coupled to one or a plurality of metallization levels arranged on the lower surface side of substrate 11, by insulated conductive vias (not detailed in the drawings) vertically crossing substrate 11. As an example, contacting pads 13 are made of a metallic material, for example, of aluminum.

FIGS. 2 to 4 illustrate devices obtained at the end of steps of forming of a microlens layer on the upper surface side of substrate 11, opposite photodetectors 12.

FIG. 2 illustrates a device obtained at the end of a step of forming of a resin layer 15 on the upper surface side of substrate 11.

Layer 15 is for example deposited full plate over the entire surface of the upper surface of substrate 11. Layer 15 thus covers contacting pads 13 and photodetectors 12. Layer 15 is made of a resin transparent to the detection wavelengths of the sensor. Layer 15 for example has a thickness in the range from 1 μm to 6 μm, for example, in the order of 4 μm.

The resin of layer 15 is for example a crosslinked resin that cannot be dissolved in usual resin development and/or etching liquid solvents. The resin of layer 15 is for example a non-photosensitive resin. As an example, the resin of layer 15 has a planar upper surface. As an example, the resin of layer 15 is selected so that it can be crosslinked, for example, by UVs or from a certain temperature, for example, in the order of 200° C. As an example, the resin of layer 15 is selected so that it can be etched by means of a physical oxygen plasma. As an example, the resin of layer 15 comprises a polymer, for example, of acrylic type.

FIG. 3 illustrates a device obtained at the end of a step of forming of an etch mask 19 on the upper surface of resin layer 15. Mask 19 comprises microlens-shaped structures, intended to be transferred into resin layer 15 during a subsequent etch step, to form microlenses in layer 15.

As an example, mask 19 is formed from a resist layer. The resin of mask 19 is for example first deposited full plate on top of and in contact with the upper surface of layer 15. At this stage, the resin of mask 19 for example has a substantially uniform thickness across the entire surface of the structure. The deposition of the resin of mask 19 may be performed by a spin coating technique or by any other adapted deposition technique. The resin layer of mask 19 is then structured, for example, by photolithography, to form, opposite photodetectors 12, separate resin pads 21. In this example, an individual resin pad 21 is provided opposite each photodetector 12 of the sensor. A flow anneal is then implemented, during which resin pads 21 deform to take the shape of microlenses. After flowing, resin pads 21 are for example separate. The described embodiments are however not limited to this specific case. Pads 21 for example have a thickness smaller than the thickness of layer 15.

FIG. 4 illustrates a device obtained at the end of a step of physical etching of layer 15 and of mask 19, resulting in transferring the pattern of mask 19 to an upper portion of layer 15. The etching is for example stopped when all the resin of mask 19 has been consumed.

Thus, in the device illustrated in FIG. 4, layer 15 comprises microlenses 23 opposite photodetectors 12. As an example, microlenses 23 have a height in the range from 0.5 μm to 3 μm.

At this stage, connection pads 13 remain covered with the resin of layer 15.

FIGS. 5 to 7 illustrate devices obtained at the end of steps of removal of the resin of layer 15 opposite pads 13, to enable to take an electric contact on pads 13.

FIG. 5 illustrates a device obtained at the end of a step of forming of a resin masking layer 25 on the upper surface of layer 15.

As an example, layer 25 is first deposited full plate on the upper surface of layer 15, for example, in contact with the upper surface of layer 15. Layer 25 is then removed, for example, by photolithography, opposite pads 13, to expose the portion of resin layer 15 coating pads 13. The resin of layer 25 is for example resist.

As an example, layer 25 has a thickness greater than the thickness of layer 15. As an example, layer 25 has a thickness in the range from 4 μm to 10 μm, for example in the order of 5 μm.

FIG. 6 illustrates a device obtained at the end of a step of etching of layer 15 through layer 25. During this step, layer 25 is used as an etch mask.

More particularly, during this step, the portion of layer 15 which is not covered with layer 25 is removed to expose the upper surface of contacting pads 13.

The etching implemented during this step is a physical plasma etching, called ion bombarding, dry reactive etching, or sputter etching (dry etching). Such an etching causes a removal of material by bombarding, for example, by using an oxygen plasma. The plasma used during this etch step has, for example, a different composition than the plasma used during the etching resulting in the forming of microlenses 23.

During the above-mentioned step, layers 25 and 15 are simultaneously consumed.

The etch step is for example stopped when contacting pads 13 are fully exposed and there remain no residues of layer 15 at their surface. At this stage, a portion of layer 25 remains at the surface of layer 15 opposite microlenses 23.

FIG. 7 illustrates a device obtained at the end of a step of removal of the remaining portion of layer 25 to expose the upper surface of microlenses 23. This removal step is for example performed by a wet etching with a solvent, by means of an etching solution enabling to selectively etch the material of layer 25 over the material of layer 15.

FIG. 8 illustrates a device obtained at the end of a step of deposition of a protection layer 29 made of an electrically-insulating material at the surface of the device illustrated in FIG. 7.

Layer 29 for example extends continuously over the entire upper surface of the device of FIG. 7. Thus, layer 29 particularly covers microlenses 23 and pads 13.

As an example, layer 29 is made of a material which enables to protect layer 15 from humidity. Layer 29 is for example made of an oxide, for example, silicon oxynitride (SiON).

As an example, protection layer 29 is deposited, by a conformal deposition method, on the upper surface of the device illustrated in FIG. 7, for example, by chemical vapor deposition, for example by a plasma-enhanced chemical vapor deposition (PECVD).

Layer 29 for example has a thickness in the range from 50 nm to 500 nm, for example, in the order of 300 nm.

FIGS. 9 and 10 illustrate devices obtained at the end of steps of local removal of protection layer 29 vertically in line with all or part of each of contacting pads 13, to enable to take an electric contact on pads 13.

FIG. 9 illustrates a device obtained at the end of a step of deposition of a resin layer 31 on the upper surface of the device of FIG. 8, and of forming, in resin layer 31, of a through opening 33 emerging onto protection layer 29 opposite pad 13. Opening 33 is for example formed by photolithography.

FIG. 10 illustrates a device obtained at the end of a step of etching of protection layer 29 at the bottom of opening 33, by using resin layer 31 as an etch mask. At the end of this etching, layer 31 is removed.

A disadvantage of the above-described method is that, at the step described in relation with FIG. 6, the etching by ion bombarding of layers 15 and 25 results in the forming of fibers or filaments of polymers on the sides of layer 15. These filaments are for example made of crosslinked carbon for example including sputtered silicon. These filaments may in particular extend beyond the upper surface of layer 15. The polymer fibers or filaments non-homogeneously cover the side of layer 15. Thus, the layer 29 deposited at the step described in relation with FIG. 8 particularly has thickness unevennesses capable of causing tightness and integrity defects which raise an issue for the subsequent manufacturing steps and for the reliability of the device. A cleaning of the polymer filaments by wet etching may be provided between the step described in relation with FIG. 7 and the step described with FIG. 8. However, this step generates an excess cost and does not allow a full removal of the polymer fibers without damaging microlenses 23.

FIGS. 11 to 13 schematically and partially illustrate devices obtained at the end of successive steps of an example of a method of manufacturing an image sensor according to an implementation mode.

The initial steps of the method are for example identical or similar to what has been described hereabove in relation with FIGS. 1 to 5 and will not be detailed again hereafter.

According to an aspect of an implementation mode, it is provided to replace the step of etching by ion bombarding (etching said to be physical and thus anisotropic) of resin layer 15 described in relation with FIG. 6 with a totally chemical and thus isotropic plasma etching step (method sometimes designated as "dry-stripping" or "dry-ashing"). This chemical etching relies on the use of free radicals generated by remote plasmas. Such an etching implements equipment different from that implemented for the physical etch step described in relation with FIG. 6. This etching technique is currently used to remove, recycle or strip, full plate, resin layers. This technique is further sometimes used to perform, full plate, chemical treatments on the exposed materials. It is here provided to use it, in unusual fashion, to perform a local etching of resin layer 15 through the mask formed by resin layer 25. This technique has the advantage of being less aggressive than a physical etching, and generates no polymer fibers or filaments on the sides of layer 15.

FIG. 11 illustrates a device obtained at the end of the step of chemical plasma etching of resin layer 15 through the mask formed by resin layer 25.

The chemical plasma etching implemented to obtain the device illustrated in FIG. 11 consumes layers 25 and 15 simultaneously and isotropically. Thus, at the end of the etch step, layers 15 and 25 have an inclined side 35 (non-vertical). As an example, the inclination of the side 35 of layers 25 and 15 may be controlled, in particular, by a control of the etch time.

The chemical etching plasma used preferably comprises oxygen. As an example, the chemical etching plasma comprises oxygen, nitrogen, and hydrogen. As an example, the temperature of the material etched during this step is in the range from 80° C. to 250° C., for example, in the order of 150° C.

The above-mentioned etching is stopped when contacting pads 13 are exposed and there remain no residues of layer 15 at their surface. At this stage, a portion of layer 25 remains at the surface of layer 15 opposite microlenses 23.

FIG. 12 illustrates a device obtained at the end of a step of removal of the remaining portion of layer 25 to expose the upper surface of microlenses 23. This removal step is for example performed by a wet etching with a solvent, by means of an etching solution enabling to selectively etch the material of layer 25 over the material of layer 15.

The steps illustrated in FIGS. 11 and 12 are for example followed by steps of deposition of a protection layer 29, and then of opening of protection layer 29 opposite pads 13, identical or similar to what has been described hereabove in relation with FIGS. 8 to 10.

FIG. 13 illustrates the device obtained at the end of these steps.

An advantage of this embodiment is that the chemical plasma etching described in relation with FIG. 11 generates no polymer fibers, conversely to the physical etching of the step of FIG. 6. Layer 29 is thus conformally deposited at the surface of layer 15, which enables it to ensure its role of protection of layer 15. It may for example be done away with a specific step of cleaning of the polymer fibers before the deposition of layer 29.

Another advantage of this embodiment is that the chemical etch step is very selective and enables not to consume the material of substrate 11.

Another advantage of this embodiment is that the step of chemical etching of layer 15 causes the forming of a slope in this same layer 15 opposite pads 13, which slope may be modulated to increase the conformability and the resistance of the encapsulation layer 29 which covers it.

Various embodiments and variants have been described. Those skilled in the art will understand that certain features of these various embodiments and variants may be combined, and other variants will occur to those skilled in the art. In particular, the described embodiments are for example not limited to the examples of dimensions and of materials mentioned hereabove.

Finally, the practical implementation of the described embodiments and variations is within the abilities of those skilled in the art based on the functional indications given hereabove.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for manufacturing an image sensor, the method comprising:
   providing a semiconductor substrate having photodetectors arranged in a first region and contacting pads arranged in a second region distinct from the first region;
   forming a resin layer on the semiconductor substrate, wherein the resin layer covers both the photodetectors and the contacting pads, wherein the resin layer is in direct contact with sidewalls and a top surface of the contact pads, and wherein the resin layer is a single continuous layer;
   forming a first mask layer in direct contact with an upper surface of the resin layer, wherein the first mask layer comprises microlens-shaped structures arranged opposite the photodetectors;
   transferring the microlens-shaped structures into the resin layer to form microlenses in the resin layer opposite the photodetectors, with the resin layer still covering the contacting pads;
   forming a second mask layer in direct contact with the resin layer, the second mask layer covering the microlenses and leaving the resin layer covering the contacting pads exposed; and
   etching the resin layer to entirely expose the top surface of the contacting pads while maintaining the microlenses covered by the second mask layer,
   wherein the method is performed in the cited sequence.

2. The method according to claim 1, wherein transferring the microlens-shaped structures into the resin layer comprises physical etching.

3. The method according to claim 2, wherein the physical etching comprises consuming both the resin layer and the microlens-shaped structures and stopping the physical etching when the microlens-shaped structures are totally consumed.

4. The method according to claim 1, wherein a thickness of the microlens-shaped structures is smaller than a respective thickness of the resin layer, and wherein the thickness of the resin layer is in a range from 1 µm to 6 µm.

5. The method according to claim 1, wherein the resin layer is made of an acrylic polymer.

6. The method according to claim 1, wherein the microlenses have a height in a range from 0.5 µm to 3 µm.

7. The method according to claim 1, wherein the microlenses are made of the same material as the resin layer, and wherein the microlenses are part of the resin layer.

8. The method according to claim 1, wherein etching the resin layer comprises simultaneously consuming both the resin layer and the second mask layer and stopping etching when the resin layer covering the contacting pads is totally consumed thus exposing the contacting pads.

9. The method according to claim 8, wherein etching the resin layer comprises physical plasma etching, and wherein etching comprises anisotropic etching.

10. The method according to claim 9, wherein, after etching the resin layer, the resin layer has a substantially vertical sidewall facing the contacting pads.

11. The method according to claim 8, wherein etching the resin layer comprises chemical plasma etching, and wherein etching comprises isotropic etching.

12. The method according to claim 11, wherein, after etching the resin layer, the resin layer has an inclined sidewall facing the contacting pads.

13. The method according to claim 1, wherein the second mask layer has a thickness that is greater than a thickness of the resin layer, and wherein the thickness of the second mask layer is in a range from 4 µm to 10 µm.

14. The method according to claim 1, wherein the resin layer and the micro lenses microlenses are made of a crosslinked resin resistant to wet etching.

15. The method according to claim 14, further comprising, after etching the resin layer, removing the second mask layer covering the microlenses by a wet etching with a solvent so that the second mask layer is selectively removed to expose the microlenses.

16. The method according to claim 15, further comprising, after removing the second mask layer, conformally depositing a protection layer made of an electrically insulating material covering the microlenses and the sidewalls and the top surface of the contacting pads.

17. The method according to claim 16, further comprising, after conformally depositing the protection layer, forming an opening in the protection layer at the contacting pads to expose the top surface of the contacting pads.

18. The method according to claim 16, wherein conformally depositing the protection layer comprises plasma-enhanced chemical vapor deposition (PECVD).

19. The method according to claim 1, wherein the semiconductor substrate comprises, in the second region, conductive vias vertically crossing the semiconductor substrate and a plurality of metallization levels, and wherein the contacting pads are coupled to the plurality of metallization levels through the conductive vias.

20. A method for manufacturing an image system, the method comprising:
   providing a semiconductor substrate having photodetectors arranged in a first region and contacting pads arranged in a second region distinct from the first region;
   forming a resin layer on the semiconductor substrate, wherein the resin layer covers both the photodetectors and the contacting pads, wherein the resin layer is in direct contact with sidewalls and a top surface of the contacting pads, and wherein the resin layer is a single continuous layer;

forming a first mask layer in direct contact with an upper surface of the resin layer, the first mask layer comprising microlens-shaped structures arranged opposite the photodetectors;

transferring the microlens-shaped structures into the resin layer to form microlenses in the resin layer opposite the photodetectors, with the contacting pads covered by the resin layer;

forming a second mask layer in direct contact with the resin layer, the second mask layer covering the microlenses and leaving the resin layer covering the contacting pads exposed;

etching the resin layer to entirely expose the top surface of the contacting pads while maintaining the microlenses covered by the second mask layer;

removing the second mask layer covering the microlenses by a wet etching with a solvent so that the second mask layer is selectively removed to expose the microlenses;

conformally depositing a protection layer made of an electrically insulating material covering the microlenses and the sidewalls and the top surface of the contacting pads;

forming an opening in the protection layer at the contacting pads to expose the top surface of the contacting pads; and providing an external device and connecting the contacting pads to the external device by electrically-conductive wires, wherein the image system is formed by performing the method in the cited sequence.

\* \* \* \* \*